United States Patent
Imamura et al.

(10) Patent No.: US 10,546,764 B2
(45) Date of Patent: Jan. 28, 2020

(54) SUBSTRATE CLEANING APPARATUS AND SUBSTRATE PROCESSING APPARATUS

(71) Applicant: EBARA CORPORATION, Tokyo (JP)

(72) Inventors: Akira Imamura, Tokyo (JP); Mitsuru Miyazaki, Tokyo (JP); Junji Kunisawa, Tokyo (JP); Shunsuke Matsuzawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 310 days.

(21) Appl. No.: 15/432,471

(22) Filed: Feb. 14, 2017

(65) Prior Publication Data

US 2017/0236730 A1 Aug. 17, 2017

(30) Foreign Application Priority Data

Feb. 15, 2016 (JP) ................. 2016-026134

(51) Int. Cl.
B08B 1/04 (2006.01)
H01L 21/67 (2006.01)

(52) U.S. Cl.
CPC ............... *H01L 21/67051* (2013.01)

(58) Field of Classification Search
CPC .............................. H01L 21/67046; H01L 21/67253; B08B 1/04
See application file for complete search history.

(56) References Cited

U.S. PATENT DOCUMENTS

| | | | |
|---|---|---|---|
| 2002/0029431 A1* | 3/2002 | Oikawa | B08B 1/04 15/77 |
| 2007/0221249 A1* | 9/2007 | Sugarman | B08B 1/04 134/6 |
| 2008/0289652 A1 | 11/2008 | Hamada | |
| 2011/0308545 A1* | 12/2011 | Luechinger | H01L 31/02008 134/6 |
| 2014/0310895 A1* | 10/2014 | Chen | H01L 21/67046 15/21.1 |
| 2015/0027491 A1* | 1/2015 | Sakata | H01L 21/67046 134/6 |
| 2015/0221531 A1 | 8/2015 | Tanaka | |

FOREIGN PATENT DOCUMENTS

| | | |
|---|---|---|
| JP | 2002-050602 A | 2/2002 |
| JP | 2005-277082 A | 10/2005 |
| JP | 2006-261393 A | 9/2006 |
| JP | 2006-332534 A | 12/2006 |
| JP | 2008-515171 A | 5/2008 |
| JP | 2014-038983 A | 2/2014 |
| JP | 2015-089531 A | 5/2015 |

OTHER PUBLICATIONS

Japan Patent Application No. 2016-026134; Notice of Reasons for Refusal; dated Jun. 25, 2019; 8 pages.

* cited by examiner

*Primary Examiner* — Joseph L. Perrin
*Assistant Examiner* — Irina Graf
(74) *Attorney, Agent, or Firm* — Baker Hostetler LLP (57) ABSTRACT

A substrate cleaning apparatus comprises: a cleaning member 11, 21 that comes into contact with a substrate W and cleans the substrate W; a member rotating unit 15, 25 that rotates the cleaning member 11, 21; a pressing drive unit 19, 29 that presses the cleaning member 11, 21 against the substrate W; a torque detecting unit 16, 26 for detecting torque applied to the member rotating unit 15, 25; and a control unit 50 that controls pressing force on the basis of a result of detection by the torque detecting unit 16, 26.

7 Claims, 5 Drawing Sheets

SUBSTRATE CLEANING APPARATUS AND SUBSTRATE PROCESSING APPARATUS

CROSS REFERENCE TO RELATED APPLICATION

This application claims the benefit of foreign priority to Japanese Patent Application No. 2016-026134, filed Feb. 15, 2016, which is incorporated by reference in its entirety.

TECHNICAL FIELD

The present invention relates to a substrate cleaning apparatus and substrate processing apparatus for treating a substrate such as a semiconductor wafer.

BACKGROUND ART

In recent years, with the micro-miniaturization of semiconductor devices, substrates having a microstructure (substrates formed with various material films having different physical properties) have been fabricated. For example, at a damascene interconnect forming step of filling a wiring gutter formed on a substrate with metal, after the formation of damascene interconnect, excess metal is polished and removed by a substrate polishing apparatus (a chemical mechanical polishing (CMP) apparatus), and various material films having different physical properties (a metal film, a barrier film, an insulating film, etc.) are formed on the surface of the substrate. On the surface of this substrate, there exist a residue of slurry used in CMP and metal swarf (Cu swarf or the like) resulting from the CMP. Therefore, if cleaning of the surface of the substrate is not thoroughly done, such as when the surface of the substrate is complicated and difficult to be cleaned, leakage or adhesion failure is caused by the effect of the residue, etc., which may cause a decrease in reliability. Accordingly, in a CMP apparatus that polishes a semiconductor substrate, at a cleaning step after polishing, roller-member scrubbing or pen-member scrubbing is performed.

As for the roller-member scrubbing, there is known the following procedure: a load cell for measuring the load on a roller member is installed between a lifting unit of a lift mechanism and a roller member holder, and the load on the roller member is controlled to be fed back through a control device of an actuator on the basis of the value measured by the load cell (for example, see JP 2014-38983 A).

SUMMARY OF INVENTION

Technical Problem

However, in the case where a CMP apparatus adopts a load cell as disclosed in JP 2014-38983 A, the CMP apparatus cannot accurately detect the force applied from the load cell to a substrate, and may fail to correctly measure a desirable force applied from a roller member to clean the substrate.

The present invention has been made in view of this, and is intended to provide a substrate cleaning apparatus and substrate processing apparatus capable of cleaning a substrate by applying a desirable force from a cleaning member, such as a roller member or a pen member, to the substrate.

Solution to Problem

A substrate cleaning apparatus according to the present invention comprises:

a cleaning member that comes into contact with a substrate and cleans the substrate;
a member rotating unit that rotates the cleaning member;
a pressing drive unit that presses the cleaning member against the substrate;
a torque detecting unit for detecting torque applied to the member rotating unit; and
a control unit that controls pressing force of the cleaning member on the substrate exerted by the pressing drive unit on the basis of a result of detection by the torque detecting unit.

The substrate cleaning apparatus according to the present invention may further comprise a pressing-force detecting unit for detecting the pressing force,
wherein the control unit may control the pressing force on the basis of a result of detection by the pressing-force detecting unit.

In the substrate cleaning apparatus according to the present invention,
the control unit may control the pressing force on the basis of the result of the detection by the pressing-force detecting unit from when the cleaning member comes into contact with the substrate until a first time elapses, and, after elapse of the first time, the control unit may control the pressing force on the basis of the result of the detection by the torque detecting unit.

In the substrate cleaning apparatus according to the present invention,
the control unit may determine whether the pressing force is within a first range on the basis of the result of the detection by the pressing-force detecting unit when a first time elapses, and, if the pressing force is out of the first range, the control unit may control the pressing drive unit so that the pressing force is within the first range.

In the substrate cleaning apparatus according to the present invention,
the torque detecting unit may detect the torque multiple times within a predetermined time, and
the control unit may control the pressing force on the basis of values of the multiple torques detected by the torque detecting unit.

The substrate cleaning apparatus according to the present invention may further comprise a cleaning-solution supply unit for supplying cleaning solution to the substrate,
wherein the control unit may control the pressing force so that values of torques used for at least two different kinds of cleaning solution differ from each other.

In the substrate cleaning apparatus according to the present invention,
the control unit may control the pressing drive unit continuously or intermittently so that the torque is within a second range on the basis of the result of the detection by the torque detecting unit.

The substrate cleaning apparatus according to the present invention may further comprise spindles for rotating the substrate,
wherein the control unit may control the pressing drive unit so that the torque does not become equal to or more than a first threshold on the basis of the result of the detection by the torque detecting unit, thereby preventing rotation of the substrate from being stopped.

A substrate processing apparatus may comprise the substrate cleaning apparatus according to the present invention.

In the present invention, the torque detecting unit detects the torque applied to the member rotating unit, and the control unit controls the pressing force of the cleaning member on a substrate on the basis of a result of the detection by the torque detecting unit. Consequently, the substrate can be cleaned by accurately applying a desirable force to the substrate from the cleaning member such as a roller member and a pen member.

DETAILED DESCRIPTION

Embodiment
[Configuration]

An exemplary embodiment of a substrate cleaning apparatus and substrate processing apparatus according to the present invention is described below with reference to accompanying drawings. FIGS. 1 to 5 are diagrams illustrating the embodiment.

Figure 1:
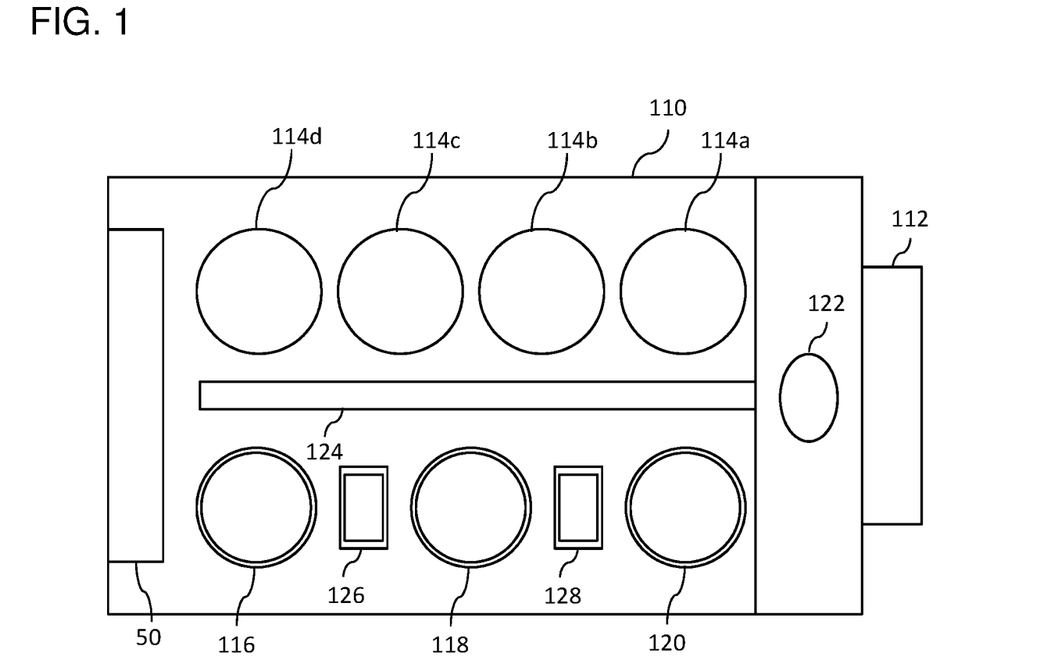
FIG. 1 is a top view showing an entire configuration of a substrate processing apparatus including a substrate processing apparatus according an embodiment of the present invention.

As shown in FIG. 1, the substrate processing apparatus has a roughly rectangular housing 110 and a load port 112; a substrate cassette (not shown) that stocks a number of substrates W (see FIG. 2, etc.) is put on the load port 112. The load port 112 is placed adjacent to the housing 110. The load port 112 can be loaded with an open cassette, a SMIF (Standard Manufacturing Interface) pod, or a FOUP (Front Opening Unified Pod). A SMIF pod and a FOUP are a hermetically sealed enclosure that stores therein a substrate cassette and covers it with a bulkhead, and whereby an environment independent of the external space can be maintained. The substrate W is, for example, a semiconductor wafer (hereinafter, referred to as "wafer") and the like.

Inside the housing 110, a plurality of (in an aspect shown in FIG. 1, four) polishing units 114a to 114d, first and second cleaning units 116 and 118 for cleaning a polished substrate W, and a drying unit 120 for drying the cleaned substrate W are contained. The polishing units 114a to 114d are arranged along a long side of the substrate processing apparatus, and the cleaning units 116 and 118 and the drying unit 120 are also arranged along the long side of the substrate processing apparatus.

In an area surrounded by the load port 112, and the polishing unit 114a and the drying unit 120 that are located on the side of the load port 112, a first transfer robot 122 is placed. Furthermore, a conveyance unit 124 is placed parallel to the polishing units 114a to 114d as well as the cleaning units 116 and 118 and the drying unit 120. The first transfer robot 122 receives a pre-polished substrate W from the load port 112 and transfers the substrate W to the conveyance unit 124, or receives from the conveyance unit 124 a dried substrate W retrieved from the drying unit 120.

A second transfer robot 126 for transferring a substrate W between the first cleaning unit 116 and the second cleaning unit 118 is placed between the first cleaning unit 116 and the second cleaning unit 118, and a third conveyance unit 128 for transferring the substrate W between the second cleaning unit 118 and the drying unit 120 is placed between the second cleaning unit 118 and the drying unit 120. Furthermore, inside the housing 110, a control unit 50 for controlling the operation of each device of the substrate processing apparatus is placed. In the present embodiment, there is described the aspect in which the control unit 50 is placed inside the housing 110; however, the placement of the control unit 50 is not limited to this, and the control unit 50 may be placed outside the housing 110.

As the first cleaning unit 116 and/or the second cleaning unit 118, a roller cleaning device may be used, or a pencil cleaning device may be used, or a two-fluid jet cleaning device may be used; furthermore, any two or more of these may be used in combination. The roller cleaning device brings a roller member 11 (see FIG. 2) linearly extending about the entire length of the diameter of a substrate W into contact with the substrate W and rotates the roller member 11 around its central axis parallel to the substrate W in the presence of cleaning solution, thereby scrubbing the surface of the substrate W. The pencil cleaning device brings a cylindrical pen member 21 (see FIG. 2) extending in a vertical direction into contact with the substrate W and moves the pen member 21 in one direction while rotating the pen member 21 in the presence of cleaning solution, thereby scrubbing the surface of the substrate W. The two-fluid jet cleaning device cleans the surface of the substrate W by using two jets of fluid.

As the drying unit 120, a spin-drying unit may be used; the spin-drying unit sprays a rotating substrate W with IPA vapor from a moving spray nozzle thereby drying the substrate W, and rotates the substrate W at high speed thereby further drying the substrate W by using centrifugal force.

The cleaning solution in the present embodiment contains rinse liquid, such as deionized water (DIW), and chemical liquid, such as ammonia hydrogen peroxide (SC1), hydrochloric acid hydrogen peroxide (SC2), sulfuric acid hydrogen peroxide (SPM), sulfuric acid hydrolysate, or hydrofluoric acid. In the present embodiment, unless otherwise specified, cleaning solution means either rinse liquid or chemical liquid.

Figure 2:
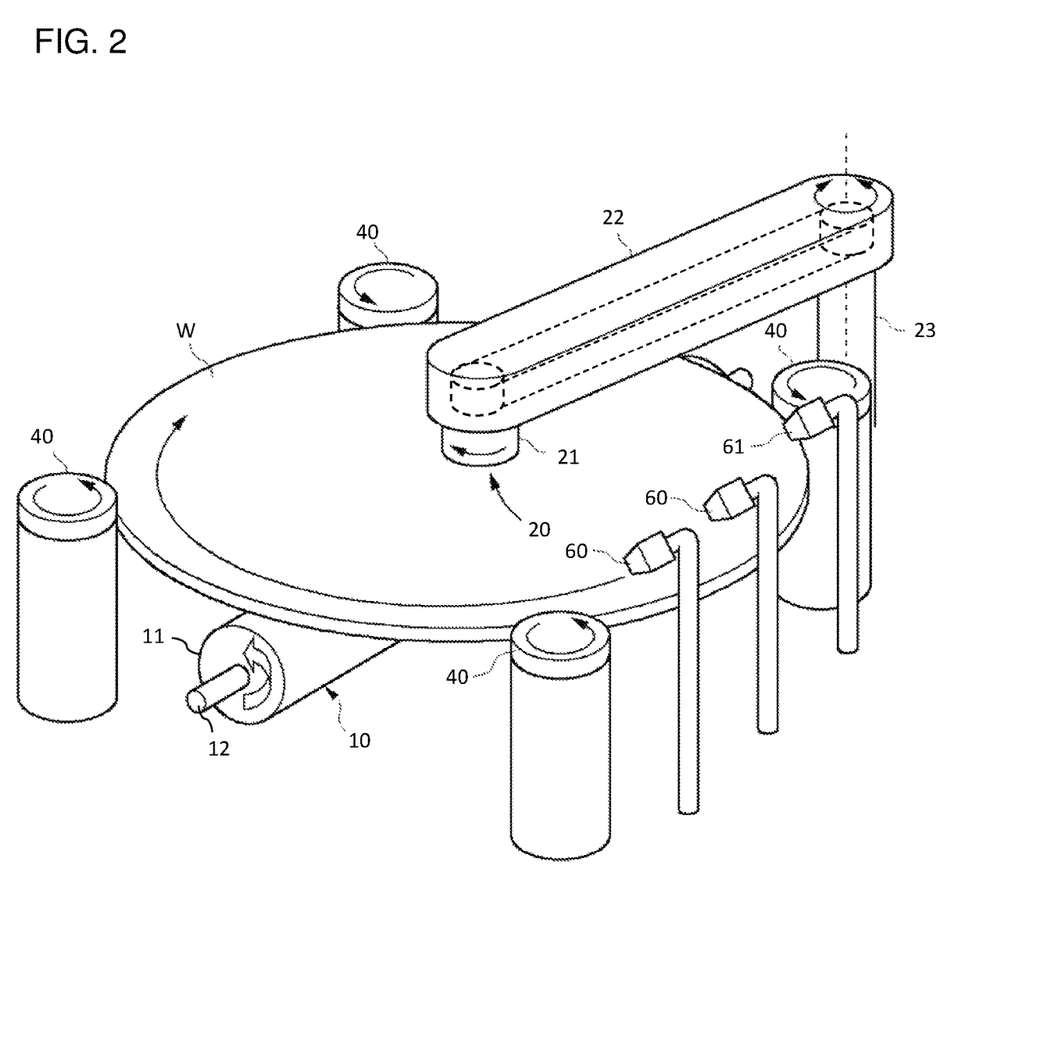
FIG. 2 is a perspective view showing an example of a substrate cleaning apparatus according the embodiment of the present invention.

As shown in FIG. 2, the substrate cleaning apparatus has a substrate rotating mechanism (in the present embodiment, see a support member 40 to be described later) for holding and rotating a substrate W and a cleaning-solution supply unit 60 for supplying cleaning solution to the substrate W. Furthermore, the substrate cleaning apparatus may have a slurry supply unit 61 for supplying slurry. Incidentally, in the present embodiment, the cleaning-solution supply unit 60 and the slurry supply unit 61 are separate parts; however, the present invention is not limited to this aspect, alternatively, cleaning solution and slurry may be supplied from the same supply unit.

A substrate W rotates around its central axis (an axis passing through a center O of the substrate W and normal to the surface of the substrate W) as a rotation axis. The central axis may be in a vertical direction, or may be in a horizontal direction, or may be in an inclined direction other than the vertical direction and the horizontal direction. Incidentally, when the substrate W extends in the vertical direction (i.e., when the rotation axis is in the horizontal direction), it is helpful in providing cleaning solution to the front and back surfaces of the substrate W in the same manner. On the other hand, when the substrate W extends in the horizontal direction (i.e., when the rotation axis is in the vertical direction), it is helpful in providing more cleaning solution to the front surface of the substrate W. Incidentally, in the present embodiment, there is mainly described the aspect in which a substrate W extends along the horizontal direction and its rotation axis extends in the vertical direction; however, the present invention is not limited to this aspect.

The substrate rotating mechanism in the present embodiment may have four support members 40 that support the outer periphery of a substrate W. The support members 40 are, for example, spindles, chucks, or the like. The substrate W can be rotated by the rotation of the spindles, chucks, or the like. In the aspect shown in FIGS. 2 and 3, spindles are used; however, the support members 40 are not limited to this, and chucks can be used as well.

The substrate cleaning apparatus may have a pencil cleaning device 20 and a roller cleaning device 10 that clean a substrate W. As an example, as shown in FIG. 2, the pencil cleaning device 20 may clean the front surface (the upper surface in FIG. 2) of the substrate W, and the roller cleaning device 10 may clean the back surface (the undersurface in FIG. 2) of the substrate W. The pencil cleaning device 20 is not limited to this aspect, and may be configured to clean the back surface of the substrate W or both the front and back surfaces of the substrate W. Furthermore, the roller cleaning device 10 may be configured to clean the front surface of the substrate W or both the front and back surfaces of the substrate W.

Figure 3:
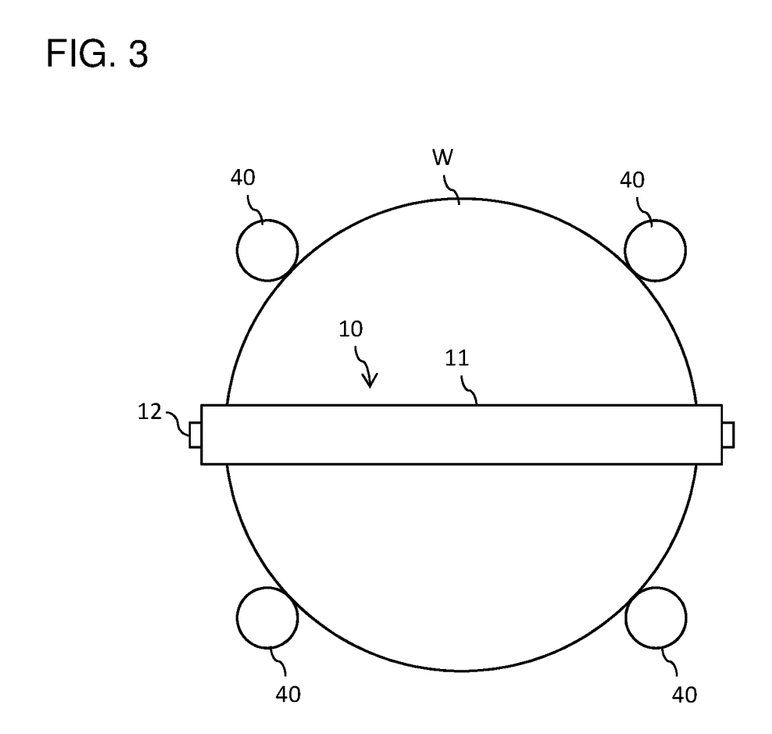
FIG. 3 is a top view showing a roller cleaning device used in the embodiment of the present invention.
Figure 4:
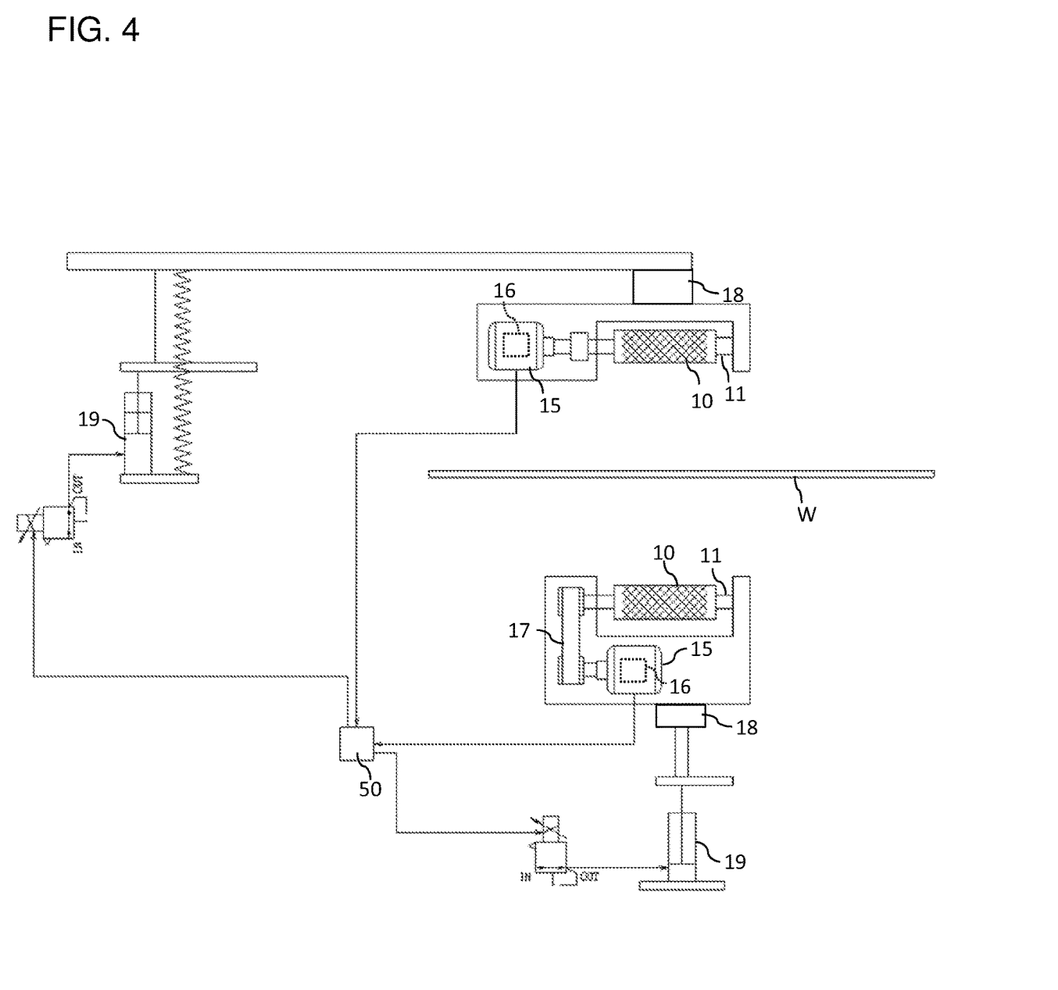
FIG. 4 is a configuration diagram showing a schematic configuration of the roller cleaning device used in the embodiment of the present invention.

As shown in FIGS. 3 and 4, the roller cleaning device 10 in the present embodiment has the roller member 11 and a support unit 12 for supporting the roller member 11. As shown in FIG. 4, the roller cleaning device 10 also has a roller-member rotating unit 15 and a roller pressing drive unit 19; the roller-member rotating unit 15 is composed of a motor or the like for rotating the roller member 11, and the roller pressing drive unit 19 presses the roller member 11 against a substrate W or moves the roller member 11 away from the substrate W. Incidentally, the roller cleaning device 10 may be provided with a transmitting unit 17 including a belt or the like that is looped around the roller-member rotating unit 15 and transmits a rotating force generated by the roller-member rotating unit 15 to the roller member 11.

Figure 5:
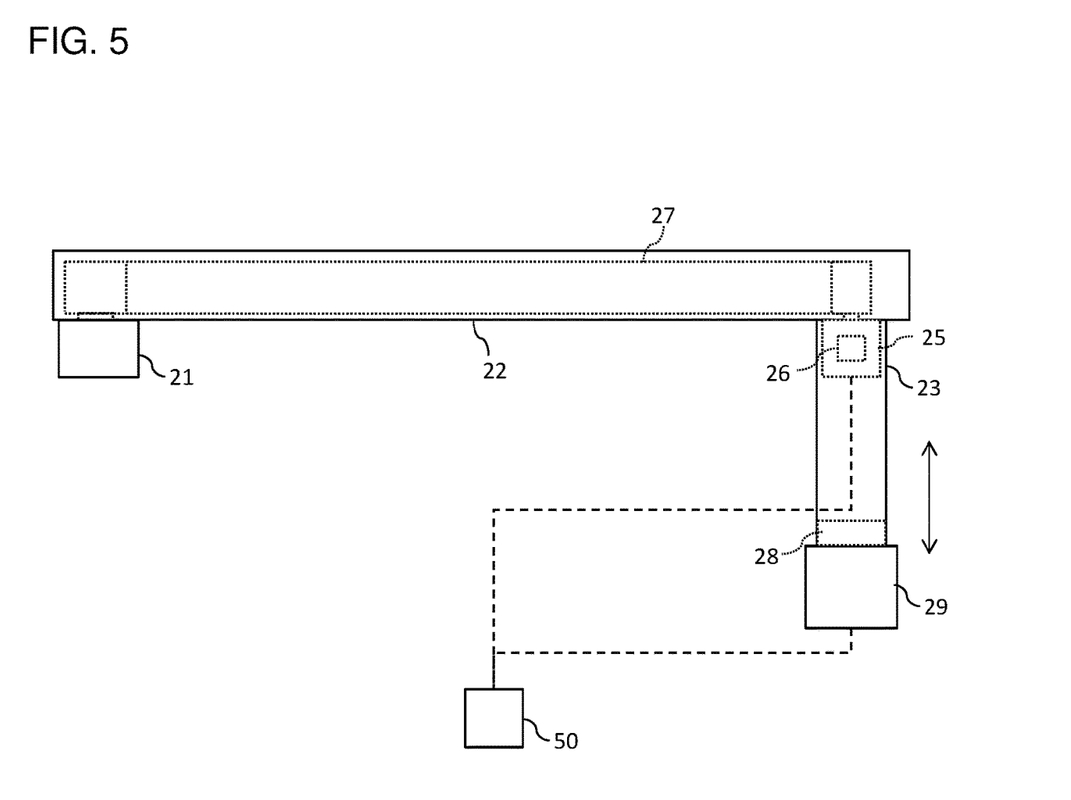
FIG. 5 is a side view showing a part of a pencil cleaning device used in the embodiment of the present invention.

As shown in FIG. 5, the pencil cleaning device 20 in the present embodiment has a rotatable support shaft 23, a swing arm 22 supported by the support shaft 23, the pen member 21 that is installed below the tip of the swing arm 22 and is composed of a cleaning sponge or the like, a pen-member rotating unit 25 composed of a motor or the like that rotates the pen member 21, and a transmitting unit 27 including a belt or the like that is looped around the pen-member rotating unit 25 and transmits a rotating force generated by the pen-member rotating unit 25 to the pen member 21. The pencil cleaning device 20 has a pen pressing drive unit 29 that presses the pen member 21 against a substrate W or moves the pen member 21 away from the substrate W.

As just described, the substrate cleaning apparatus in the present embodiment has a cleaning member 11, 21 that comes into contact with a substrate W and cleans the substrate W, a member rotating unit 15, 25 that rotates the cleaning member 11, 21, and a pressing drive unit 19, 29 that presses the cleaning member 11, 21 against the substrate W. Incidentally, the cleaning member 11, 21 includes the above-described roller member 11 and the above-described pen member 21. The member rotating unit 15, 25 includes the above-described roller-member rotating unit 15 and the above-described pen-member rotating unit 25. The pressing drive unit 19, 29 includes the above-described roller pressing drive unit 19 and the above-described pen pressing drive unit 29.

As shown in FIGS. 4 and 5, the substrate cleaning apparatus in the present embodiment further has a torque detecting unit 16, 26 for detecting torque applied to the member rotating unit 15, 25 and a pressing-force detecting unit 18, 28 for detecting pressing force of the cleaning member 11, 21 on a substrate W exerted by the pressing drive unit 19, 29. As the pressing-force detecting unit 18, 28, for example, a load cell may be used.

The above-described control unit 50 controls pressing force of the cleaning member 11, 21 on a substrate W exerted by the pressing drive unit 19, 29 on the basis of a result of the detection by the torque detecting unit 16, 26. More specifically, the control unit 50 may control the pressing force of the cleaning member 11, 21 on the substrate W so that torque applied to the member rotating unit 15, 25 falls within a certain range (within a second range to be described later) or becomes a constant value.

The control unit 50 may control pressing force of the cleaning member 11, 21 on a substrate W exerted by the pressing drive unit 19, 29 also on the basis of a result of the detection by the pressing-force detecting unit 18, 28.

Furthermore, the control unit 50 may control pressing force of the cleaning member 11, 21 on a substrate W exerted by the pressing drive unit 19, 29 on the basis of a result of the detection by the pressing-force detecting unit 18, 28 from when the cleaning member 11, 21 comes (came) into contact with the substrate W until a first time (for example, one to three seconds) elapses, and, after the elapse of the first time, the control unit 50 may control the pressing force on the basis of a result of the detection by the torque detecting unit 16, 26. Incidentally, instead of this aspect, the control unit 50 may perform the control (threshold control) so that the pressing force of the cleaning member 11, 21 on the substrate W does not become excessively high or excessively low on the basis of a result of the detection by the pressing-force detecting unit 18, 28.

Moreover, the control unit 50 may determine whether the pressing force of the cleaning member 11, 21 on the substrate W is within a first range on the basis of a result of the detection by the pressing-force detecting unit 18, 28 when the first time elapses, and, if the pressing force is out of the first range, the control unit 50 may control the pressing drive unit 19, 29 so that the pressing force is within the first range.

The torque detecting unit 16, 26 may detect torque multiple times within a predetermined time, and the control unit 50 may control the pressing force on the basis of values of the multiple torques detected by the torque detecting unit 16, 26 (for example, by using an average value of the values of the multiple torques). Furthermore, the torque detecting unit 16, 26 may detect torque at predetermined time intervals (for example, at intervals of 0.1 to 0.3 seconds). As an example, the control unit 50 may control the pressing force on the basis of results of two to five continuous detections. For example, three values of torques are obtained at intervals of 0.1 seconds, and the pressing force applied to the substrate W from the cleaning member 11, 21 may be controlled by using an average value of these.

Incidentally, when the member rotating unit 15, 25 rotates at the predetermined number of rotations, the member rotating unit 15, 25 seeks to achieve the predetermined number of rotations, so the value of torque applied alternates between high and low. That is, when the torque becomes high at some point, the pressing force applied to the substrate W from the cleaning member 11, 21 is controlled to be reduced, and, as a result, the torque becomes low. When the torque has become low in this way, the pressing force applied to the substrate W from the cleaning member 11, 21 is controlled to be increased, and, as a result, the torque becomes high. By this repetition, the control of the member rotating unit 15, 25 is performed; therefore, by using an average value, the member rotating unit 15, 25 can be controlled by using the highly accurate value of torque.

When the roller member 11 is used as the cleaning member 11, 21, the torque detecting unit 16, 26 detects torque multiple times within a time taken for the roller member 11 to make n rotations ("n" is an integer number), and the pressing force applied to the substrate W from the cleaning member 11, 21 may be controlled by using an average value of these.

The control unit 50 may control the torque so that the values of torques used for at least two different kinds of cleaning solution differ from each other. Furthermore, when the type of a substrate W is different, the control unit 50 may control the pressing force applied to the substrate W from the cleaning member 11, 21 so that a different value of torque is applied.

The control unit 50 may control the pressing drive unit 19, 29 so that the torque is within the second range on the basis of a result of the detection by the torque detecting unit 16, 26. Furthermore, the control unit 50 may intermittently detect whether the torque is within the second range on the basis of a result of the detection by the torque detecting unit 16, 26 at predetermined time intervals, and, if the torque is out of the second range, the control unit 50 may control the pressing drive unit 19, 29 so that the torque is within the second range. Moreover, the control unit 50 may continuously detect whether the torque is within the second range on the basis of a result of the detection by the torque detecting unit 16, 26, and appropriately adjust the torque so as not to be out of the second range.

When spindles are adopted as the support members 40, the control unit 50 may control the pressing drive unit 19, 29 so that the torque does not become equal to or more than a first threshold on the basis of a result of the detection by the torque detecting unit 16, 26, thereby preventing the rotation of the substrate W from being stopped. The first threshold may be determined on the basis of a value when the substrate W does not rotate or stops rotating empirically, or may be determined on the basis of a value when the substrate W does not rotate theoretically. For example, a value equal to or less than 10% to 30% of the value of torque when the substrate W does not rotate or stops rotating empirically or a value equal to or less than 10% to 30% of the value of torque when the substrate W does not rotate theoretically may be set as the first threshold.

[Method]

An example of a method to process a substrate W (a substrate processing method) by the substrate processing apparatus in the present embodiment is as follows. Incidentally, all the aspects described in above [Configuration] can be applied in [Method], and vice versa, i.e., all the aspects described in [Method] can be applied in [Configuration]. Furthermore, a program for implementing the method in the present embodiment may be recorded on a recording medium, and a computer (not shown) may read out this program from the recording medium and cause the substrate processing apparatus to implement the method in the present embodiment.

First, a substrate W is supported by the support members 40 such as spindles (see FIG. 2).

Then, the substrate W is rotated, and cleaning solution is supplied from the cleaning-solution supply unit 60 to the substrate W, and slurry is supplied from the slurry supply unit 61 to the substrate W.

Then, the cleaning member 11, 21 such as the roller member 11 and the pen member 21 is rotated by the member rotating unit 15, 25, and is moved to the side of the substrate W and brought into contact with the substrate W by the pressing drive unit 19, 29 (see FIGS. 4 and 5).

Then, from when the cleaning member 11, 21 comes (came) into contact with the substrate W until the first time elapses, the pressing force of the cleaning member 11, 21 on the substrate W exerted by the pressing drive unit 19, 29 is controlled so as to be within the first range on the basis of a result of the detection by the pressing-force detecting unit 18, 28. Incidentally, instead of this aspect, whether the pressing force of the cleaning member 11, 21 on the substrate W is within the first range may be determined on the basis of a result of the detection by the pressing-force detecting unit 18, 28 when the first time elapses, and, if the pressing force is out of the first range, the pressing drive unit 19, 29 may be controlled so that the pressing force is within the first range. More specifically, when the pressing force is weak and is out of the first range, the pressing force is increased so as to be within the first range; and when the pressing force is strong and is out of the first range, the pressing force is reduced so as to be within the first range.

After the elapse of the first time since the cleaning member 11, 21 comes (came) into contact with the substrate W, the control unit 50 continuously or intermittently determines whether the torque is within the second range on the basis of a result of the detection by the torque detecting unit 16, 26, and controls the pressing drive unit 19, 29 so that the torque is within the second range. At this time, the torque detecting unit 16, 26 detects the torque multiple times within a predetermined time, and the control unit 50 controls the pressing force on the basis of values of the multiple torques detected by the torque detecting unit 16, 26 (for example, by using an average value of the values of the multiple torques). Also in this case, when the pressing force is weak and is out of the second range, the pressing force is increased so as to be within the second range; and when the pressing force is strong and is out of the second range, the pressing force is reduced so as to be within the second range.

When the pen member 21 is used as the cleaning member 11, 21, while cleaning the substrate W, the cleaning member 11, 21 may be swung from the center to the periphery of the substrate W, or may be swung from the periphery to the center of the substrate W. Since the area of the periphery to be cleaned is wide, the swing speed of the cleaning member 11, 21 may be slowed down when the cleaning member 11, 21 cleans the peripheral area of the substrate W as compared with the case where the cleaning member 11, 21 cleans the center area of the substrate W. The swing speed may be changed continuously, or may be changed intermittently.

Incidentally, when the cleaning solution used is chemical liquid, rinse liquid is supplied afterward, and the same process as described above is performed. When the substrate W is cleaned by rinse liquid in this way, the control unit 50 may control the pressing force of the cleaning member 11, 21 on the substrate W exerted by the pressing drive unit 19, 29 so that a different torque from the case where the chemical liquid is used is applied to the member rotating unit 15, 25. Incidentally, in some cases, not rinse liquid but different chemical liquid is further supplied to the substrate W. Also in this case, the control unit 50 may control the pressing force of the cleaning member 11, 21 on the substrate W exerted by the pressing drive unit 19, 29 so that a torque corresponding to the different chemical liquid is applied to the member rotating unit 15, 25.

[Actions/Effects]

Subsequently, the actions and effects in the above-described configuration in the present embodiment are described with a focus on those not yet described.

In the present embodiment, the torque detecting unit 16, 26 (see FIGS. 4 and 5) detects the torque applied to the member rotating unit 15, 25, and the control unit 50 controls the pressing force of the cleaning member 11, 21 on a substrate W on the basis of a result of the detection by the torque detecting unit 16, 26. Therefore, the force applied to the member rotating unit 15, 25, such as friction force from the substrate W, can be directly detected (or information of the location near the substrate W can be acquired). Consequently, the substrate W can be cleaned by accurately applying a desirable force to the substrate W from the cleaning member 11, 21 such as the roller member 11 and the pen member 21. As an example, it can be configured that the control unit 50 determines whether the torque is within the second range on the basis of a result of the detection by the torque detecting unit 16, 26, and controls the pressing drive unit 19, 29 so that the torque is within the second range.

Furthermore, according to the present embodiment, the force applied to the member rotating unit 15, 25, such as friction force from the substrate W, is directly detected; therefore, for example, even when the surface of the member rotating unit 15, 25 has degraded with time, force can be applied to the substrate W from the member rotating unit 15, 25 in consideration of its influence.

On the other hand, in the case where the pressing force of the cleaning member 11, 21 on a substrate W is only detected, force applied to the substrate W from the member rotating unit 15, 25 is not able to be accurately detected; for example, even when the surface of the member rotating unit 15, 25 has degraded with time, the force is applied to the substrate W from the member rotating unit 15, 25 without considering its influence. Therefore, the substrate W is not able to be cleaned in as homogeneous conditions as those in the present embodiment. Incidentally, in general, when the member rotating unit 15, 25 has degraded, the torque tends to increase.

Especially, when the roller member 11 is used as the cleaning member 11, 21, the contact area with the substrate W is large as compared with the case where the pen member 21 is used; therefore, the change in torque applied to the member rotating unit 15, 25 is significant, and, as a result, there is the advantage that the high controllability can be achieved.

Furthermore, when the pressing force of the cleaning member 11, 21 on a substrate W is controlled on the basis of a result of the detection by the pressing-force detecting unit 18, 28, and the substrate W extends in the horizontal direction or the inclined direction, there is the influence of gravity, so even if the same force is applied to the substrate W from the cleaning member 11, 21, a result of the detection by the pressing-force detecting unit 18, 28 may vary between the front surface (the upper surface) and the back surface (the lower surface) of the substrate W. On the other hand, when the pressing force of the cleaning member 11, 21 on the substrate W is controlled on the basis of a result of the detection by the torque detecting unit 16, 26, it is less under the influence of gravity, so the pressing force of the cleaning member 11, 21 on the substrate W can be controlled accurately. Furthermore, the influence of gravity can be eliminated as much as possible in this way; therefore, there is the advantage that the same control can be used without changing the control aspect according to whether the cleaning member 11, 21 cleans the front surface (the upper surface) or the back surface (the lower surface) of the substrate W.

Incidentally, even when the pressing force applied by the pressing drive unit 19, 29 is a constant value, the torque applied from a substrate varies greatly according to the type of the substrate W. According to an experiment done by the inventors of the present application, when wafers were cleaned under the constant pressing force, a torque applied from a hydrophobic wafer was about 1.6 to 1.7 times as high as a torque applied from a hydrophilic wafer. In this regard, by adopting the present embodiment, regardless of the type of a substrate such as whether it is a hydrophilic wafer or a hydrophobic wafer, the value of torque applied from a substrate can be a constant value.

Furthermore, even when the pressing force applied by the pressing drive unit 19, 29 is a constant value, the torque applied from a substrate varies greatly according to the kind of cleaning solution. According to an experiment done by the inventors of the present application, when wafers were cleaned under the constant pressing force, a torque applied from a wafer when cleaning solution A was used was about 1.5 times as high as a torque applied from a wafer when cleaning solution B was used. In this regard, by adopting the present embodiment, regardless of the kind of cleaning solution, the value of torque applied from a substrate can be a constant value.

Moreover, when the roller member 11 is used as the cleaning member 11, 21, and the roller member 11 is composed of a member that absorbs cleaning solution, such as a sponge, the weight of the roller member 11 changes because of the absorption of the cleaning solution. Therefore, it is difficult to accurately control the pressing force of the cleaning member 11, 21 on the substrate W on the basis of a result of the detection by the pressing-force detecting unit 18, 28. On the other hand, when the pressing force of the cleaning member 11, 21 on the substrate W is controlled on the basis of a result of the detection by the torque detecting unit 16, 26, even if the roller member 11 has absorbed cleaning solution and changed its weight, these facts hardly affects. Therefore, it is possible to accurately control the pressing force of the cleaning member 11, 21 on the substrate W.

Furthermore, when the pressing force of the cleaning member 11, 21 on the substrate W is controlled on the basis of a result of the detection by the torque detecting unit 16, 26, even if the cleaning member 11, 21 has changed its weight, these facts hardly affects; therefore, there is the advantage that even different-sized roller members 11 or the like can be controlled uniformly.

Moreover, when the pressing force of the cleaning member 11, 21 on the substrate W is controlled on the basis of a result of the detection by the torque detecting unit 16, 26 in this way, the force applied to the cleaning member 11, 21 from the substrate W can be directly detected and controlled; therefore, the detailed control is possible. Accordingly, it is possible to be compatible with, for example, individual differences among the same type of substrates W, and it is possible to control the pressing force of the cleaning member 11, 21 on the substrates W according to the individual differences among the substrates W.

Incidentally, depending on the type of a substrate W, friction force caused between the cleaning member 11, 21 and the substrate W becomes too high, and, for example, when spindles are adopted, there could arise a situation that the substrate W does not rotate. Then, such a situation often occurs in such a way as to suddenly stop the rotation of the substrate W. In the present embodiment, the pressing force of the cleaning member 11, 21 on the substrate W can be controlled (be subjected to the threshold control) so that a torque equal to or more than the first threshold is not applied. According to this aspect, it is possible to prevent friction force or the like applied to the cleaning member 11, 21 from becoming too high, and possible to prevent the occurrence of a situation that the substrate W does not rotate.

When there is adopted an aspect in which the control unit 50 controls the pressing force of the cleaning member 11, 21 on the substrate W exerted by the pressing drive unit 19, 29 also on the basis of a result of the detection by the pressing-force detecting unit 18, 28, it is possible to prevent an excessively strong force from being applied to the substrate W from the cleaning member 11, 21, and also possible to prevent only an excessively weak force from being applied to the substrate W from the cleaning member 11, 21. Incidentally, in the present embodiment, the pressing-force detecting unit 18, 28 only has to roughly detect a load applied on the substrate W; therefore, a not-so-accurate, inexpensive pressing-force detecting unit 18, 28 may be used.

When there is adopted an aspect in which no transmitting unit 17, 27 for transmitting a rotating force generated by the member rotating unit 15, 25 to the cleaning member 11, 21 is installed, and the cleaning member 11, 21 is directly connected to the member rotating unit 15, 25, there is the advantage that a force applied to the cleaning member 11, 21 can be directly transmitted to the member rotating unit 15, 25, and friction force or the like applied to the cleaning member 11, 21 can be accurately reflected in the member rotating unit 15, 25.

When there is adopted an aspect in which the control unit 50 controls the pressing force of the cleaning member 11, 21 on the substrate W exerted by the pressing drive unit 19, 29 on the basis of a result of the detection by the pressing-force detecting unit 18, 28 from when the cleaning member 11, 21 comes (came) into contact with the substrate W until the first time elapses, and, after the elapse of the first time, the control unit 50 controls the pressing force on the basis of a result of the detection by the torque detecting unit 16, 26, the brief control of the force applied to the substrate W from the cleaning member 11, 21 can be performed on the basis of information from the pressing-force detecting unit 18, 28, and the detailed control of the force applied to the substrate W from the cleaning member 11, 21 can be performed on the basis of information from the torque detecting unit 16, 26. (Especially, when the rotation of the cleaning member 11, 21 or the rotation of the substrate W is performed after the cleaning member 11, 21 comes (came) into contact with the substrate W,) it is not possible to accurately detect a torque to be controlled until the rotation of the cleaning member 11, 21 and the rotation of the substrate W become certain values. On the other hand, information from the pressing-force detecting unit 18, 28 can be acquired regardless of the rotation of the cleaning member 11, 21 and the rotation of the substrate W; therefore, at the first stage, the force applied to the substrate W from the cleaning member 11, 21 is controlled by using information from the pressing-force detecting unit 18, 28, and, after that, the force applied to the substrate W from the cleaning member 11, 21 is controlled on the basis of information from the torque detecting unit 16, 26, and whereby the pressing force of the cleaning member 11, 21 on the substrate W can be controlled appropriately at an earlier stage.

When there is adopted an aspect in which the control unit 50 determines whether the pressing force is within the first range on the basis of a result of the detection by the pressing-force detecting unit 18, 28 when the first time elapses, and, if the pressing force is out of the first range, controls the pressing drive unit 19, 29 so that the pressing force is within the first range, there is the advantage that the pressing force of the cleaning member 11, 21 on the substrate W can be controlled by a little information.

When there is adopted an aspect in which the torque detecting unit 16, 26 detects torque multiple times within a predetermined time, and the control unit 50 controls the pressing force on the basis of values of the multiple torques detected by the torque detecting unit 16, 26, the pressing force can be controlled, for example, by using an averaged torque. Typically, when the cleaning member 11, 21 is the roller member 11, the wasting condition differs according to the point of the roller member 11; therefore, the value of torque detected by the torque detecting unit 16, 26 varies according to the contact point of the roller member 11 with the substrate W. Accordingly, when an averaged torque is used in this way (when a moving average is obtained), the substrate W can be cleaned by the cleaning member 11, 21 with a more appropriate force. In this regard, there is the advantage that the average is taken per time taken for the roller member 11 to make n rotations ("n" is an integer number). Incidentally, as an example, the roller member 11 makes 50 to 200 rotations per minute.

Incidentally, the value of torque detected by the torque detecting unit 16, 26 may vary also depending on the surface condition of the substrate W. Because of this, there is the advantage that torque is detected multiple times, and its average is used. Especially, when a moving average is used, there is the advantage that changes in torque can be continuously tracked.

Furthermore, when the member rotating unit 15, 25 rotates at the predetermined number of rotations, the value of torque alternates between high and low. Accordingly, in this case, as described above, there is the advantage that the torque detecting unit 16, 26 detects torque multiple times within a predetermined time, and the control unit 50 controls the pressing force on the basis of values of the multiple torques detected by the torque detecting unit 16, 26.

The magnitude of the force applied to the substrate W from the cleaning member 11, 21 may differ according to the kind of cleaning solution. Accordingly, when there is adopted an aspect in which the control unit 50 controls the torque so that the values of torques used for at least two different kinds of cleaning solution differ from each other, the substrate W can be cleaned on the basis of a desirable torque according to the kind of cleaning solution, and the substrate W can be cleaned by the cleaning member 11, 21 with a more appropriate force.

When there is adopted an aspect in which the control unit 50 continuously or intermittently controls the pressing drive unit 19, 29 so that the torque is within the second range on the basis of a result of the detection by the torque detecting unit 16, 26, during the detection, the substrate W can be constantly cleaned by the cleaning member 11, 21 with an appropriate force.

Description of each of the abovementioned embodiments and disclosure of the drawings are for exemplary purposes so as to illustrate the present invention described in the claims. The present invention described in the claims should not be restricted to the description of each of the abovementioned embodiments or the disclosure of the drawings.

REFERENCE SIGNS LIST 11 roller member (cleaning member)
15 roller-member rotating unit (member rotating unit)

16 torque detecting unit
18 pressing-force detecting unit
19 pressing drive unit (roller pressing drive unit)
21 pen member (cleaning member)
25 pen-member rotating unit (member rotating unit)
26 torque detecting unit
28 pressing-force detecting unit
29 pen pressing drive unit (pressing drive unit)
40 spindle (support members)
50 control unit
60 cleaning-solution supply unit

What is claimed is:

1. A substrate cleaning apparatus comprising:
a cleaning member that comes into contact with a substrate and cleans the substrate;
a member rotating unit that rotates the cleaning member;
a pressing drive unit that presses the cleaning member against the substrate;
a torque detecting unit for detecting torque applied to the member rotating unit;
a control unit that controls pressing force of the cleaning member on the substrate exerted by the pressing drive unit on the basis of a result of detection by the torque detecting unit; and
a pressing-force detecting unit for detecting the pressing force,
wherein the control unit controls the pressing force on the basis of a result of detection by the pressing-force detecting unit, and
wherein the control unit controls the pressing force on the basis of the result of the detection by the pressing-force detecting unit from when the cleaning member comes into contact with the substrate until a first time elapses, and, after elapse of the first time, the control unit controls the pressing force on the basis of the result of the detection by the torque detecting unit.

2. The substrate cleaning apparatus according to claim 1, wherein the control unit determines whether the pressing force is within a first range on the basis of the result of the detection by the pressing-force detecting unit when a first time elapses, and, if the pressing force is out of the first range, the control unit controls the pressing drive unit so that the pressing force is within the first range.

3. The substrate cleaning apparatus according to claim 1, wherein the torque detecting unit detects the torque multiple times within a predetermined time, and
wherein the control unit controls the pressing force on the basis of values of the multiple torques detected by the torque detecting unit.

4. The substrate cleaning apparatus according to claim 1 further comprising a cleaning-solution supply unit for supplying cleaning solution to the substrate,
wherein the control unit controls the pressing force so that values of torques used for at least two different kinds of cleaning solution differ from each other.

5. The substrate cleaning apparatus according to claim 1, wherein the control unit controls the pressing drive unit continuously or intermittently so that the torque is within a second range on the basis of the result of the detection by the torque detecting unit.

6. The substrate cleaning apparatus according to claim 1 further comprising spindles for rotating the substrate,
wherein the control unit controls the pressing drive unit so that the torque does not become equal to or more than a first threshold on the basis of the result of the detection by the torque detecting unit, thereby preventing rotation of the substrate from being stopped.

7. substrate processing apparatus comprising the substrate cleaning apparatus according to claim 1.

* * * * *